United States Patent [19]

Liu

[11] Patent Number: 5,128,728
[45] Date of Patent: Jul. 7, 1992

[54] SEMICONDUCTOR SUPERLATTICE INFRARED SOURCE

[75] Inventor: Hui C. Liu, Ottawa, Canada

[73] Assignee: National Research Council of Canada, Ottawa, Canada

[21] Appl. No.: 568,638

[22] Filed: Aug. 16, 1990

Related U.S. Application Data

[63] Continuation of Ser. No. 337,968, Apr. 14, 1989, abandoned.

[30] Foreign Application Priority Data

Jan. 13, 1989 [CA] Canada ................................ 588276

[51] Int. Cl.$^5$ ..................... H01L 27/12; H01L 45/00; H01L 33/00
[52] U.S. Cl. .......................................... 357/4; 357/17; 372/43; 372/45
[58] Field of Search ...................... 357/4, 6, 17, 16, 2; 372/43, 45

[56] References Cited

U.S. PATENT DOCUMENTS

| | | | |
|---|---|---|---|
| 4,603,340 | 7/1986 | Dil | 357/4 |
| 4,616,241 | 10/1986 | Biefeld et al. | 357/16 |
| 4,620,206 | 10/1986 | Ohta et al. | 357/4 |
| 4,644,378 | 2/1987 | Williams | 357/17 |
| 4,645,707 | 2/1987 | Davies et al. | 428/213 |
| 4,665,412 | 5/1987 | Ohkawa et al. | 357/6 |
| 4,720,309 | 1/1988 | Deveaud et al. | 148/33.1 |
| 4,799,091 | 1/1989 | Reed | 357/12 |
| 4,816,878 | 3/1989 | Kano et al. | 357/4 |

FOREIGN PATENT DOCUMENTS

| | | | |
|---|---|---|---|
| 59-46073 | 3/1984 | Japan | 357/4 |
| 63-21891 | 1/1988 | Japan | 357/4 |

OTHER PUBLICATIONS

Levine et al., "New 10 um Infrared Detetor using Intersubbard absorption in resonant tunneling GaAlAs superlattices", Appl. Phys. Let. 50 Apr. 1987 pp. 1092–1094.
Journal Applied Physics 63(8) 15 Apr 1988 pp. 2856 to 2858.

Primary Examiner—Jerome Jackson, Jr.
Assistant Examiner—D. Monin
Attorney, Agent, or Firm—Y. Toyooka; R. J. Haley

[57] ABSTRACT

An infrared emitting semiconductor device having a layer-shaped infrared emitting region with a superlattice structure. The superlattice structure consists of thin alternating narrow and wide wells separated by thin barriers. The narrow well has one quasibound state $E'_0$ while the wide well has two states $E_0$ and $E_1$ with $E'_0$ being located between $E_0$ and $E_1$. Under proper bias, an electron in state $E_0$ can resonately tunnel out of the well through the quasibound state $E'_0$ to the first excited state $E_1$ of the next wide well. This electron can then relax to the ground state $E_0$ where it can resonately tunnel to the next wide well and repeat the process. Infrared radiation with its photon energy equal to $E_1 - E_0$ is emitted as the electrons relax from $E_1$ to $E_0$ in the wide wells.

15 Claims, 1 Drawing Sheet

SEMICONDUCTOR SUPERLATTICE INFRARED SOURCE

This application is a continuation of application Ser. No. 07/337,968, filed Apr. 14, 1989 now abandoned.

FIELD OF THE INVENTION

The present invention relates to a semiconductor device with an infrared emitting active region which consists of a layered structure of semiconductor material formed of a combination of thin layers having a superlattice structure.

BACKGROUND OF THE INVENTION

U.S. Pat. No. 4,644,378 describes one type of light-emitting semiconductor device which produces radiation in the visible and near-infrared portion of the spectrum. This device has a light-emitting region formed by a layered structure with very thin active layers of a first semiconductor material located between and separated by very thin barrier layers of a second semiconductor material which has a larger energy gap than that of the first semiconductor material. These alternating very thin layers form a superlattice structure. In this device, the active layers are all of equal thickness having a thickness of n monolayers. The barrier layers are also of equal thickness having a thickness of m monolayers where n and m are integers between 2 and 7 with the value of $n+m \leq 12$. The maximum thickness of 7 monolayers is that at which the active layers are still sufficiently thin to exhibit a strong quantum well effect, while the barrier layers are thin enough to produce a pronounced zone folding effect. The active layers in this device may be formed of GaAs with the barrier layers consisting of AlAs.

U.S. Pat. No. 4,630,083 describes another type of light-emitting semiconductor device with a laminated active layer consisting of five GaAs layers about 10 nm thick and four AlGaAs layers about 10 nm thick, where the GaAs layers are separated from each other by one of the AlGaAs layers. The AlGaAs layers have a larger band gap than the GaAs layers providing a quantum well structure i.e. a superlattice structure. The GaAs ultrathin layers service as quantum wells and the AlGaAs ultrathin layers serve as barriers. Both U.S. Pat. Nos. 4,644,378 and 4,630,083 deal with transitions between conduction and valence bands in superlattice structures.

Another type of device is described in Applied Physics Letter, Vol. 51 of Sep. 21, 1987 on page 934. This device is a semiconductor photodetector with a superlattice structure, in particular a 10 μm radiation detector. This detector consists of 50 periods of 70 Å GaAs quantum wells separated by 133 Å $Al_{0.36}Ga_{0.64}As$ undoped barriers. In this device, an electron in the ground state of the quantum well can be raised to the first excited state by photoexcitation resulting in an intersubband transition in that layer. Under proper bias this electron can tunnel out of that layer providing a photon generated current. Another 10 μm infrared detector is described in Physical Review Letters, Vol. 59, No. 21, Nov. 23, 1987. This last-mentioned device provides a structure where coherent tunneling of photoexcited electrons through a double-barrier superlattice structure can occur. Each period in this laminated structure consists of a 72 Å thicker well of GaAs (doped), a 39 Å thinner barrier of undoped $Al_{0.33}Ga_{0.67}As$, a 18 Å thinner well of undoped GaAs and a 154 Å thicker barrier of undoped $Al_{0.33}Ga_{0.67}As$. The wider uncoupled wells have two states $E_1=47$ meV and $E_2=183$ meV in the energy-band diagram whereas the narrow well has only one state $E'_1=174$ meV. Under forward bias where $E'_1$ is approximately aligned with $E_2$ of the adjacent period, the coherent tunneling of a photoexcited electron from the wide well through the state $E'_1$ of the narrow well and out of the barriers is possible. These two articles are directed to infrared detectors having a superlattice structure.

SUMMARY OF THE INVENTION

An object of the present invention is to provide a new type of infrared emitting semiconductor device which emits in the mid-to-far infrared range (2 to 10 μm or longer) with a narrow emission spectrum where the wavelength which is emitted can be adjusted by varying the device parameters.

A further object of the invention is to provide an improved infrared emitter having a novel superlattice structure which utilizes intersubband transitions and resonant tunneling phenomena through double-barrier structure to generate infrared radiation.

A still further object of the present invention is to provide an infrared emitter with a special superlattice structure which gives several improvement factors to make the photoemission process favourable and efficient.

A preferred embodiment of the invention comprises an infrared-emitting semiconductor device with an active region consisting of alternating thin layers of semiconductive materials forming a finite superlattice structure wherein the structure consists of alternating narrow and wide wells separated by thin barriers in which the narrow well has only one quasibound state $E'_0$ while the wide well has two states $E_0$ and $E_1$.

In a further preferred embodiment, the superlattice structure is formed of $Al_xGa_{1-x}As$-GaAs material with x being less than or equal to 1.

BRIEF DESCRIPTION OF THE DRAWINGS

The invention will now be in more detail with reference to the accompanying drawings, wherein.

DESCRIPTION OF THE PREFERRED EMBODIMENT

Figure 1:
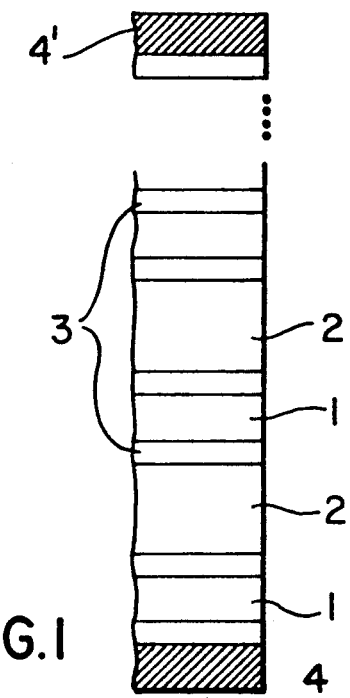
FIG. 1 is a cross-sectional view of an edge of an infrared emitting semiconductor device according to the present invention.
Figure 2:
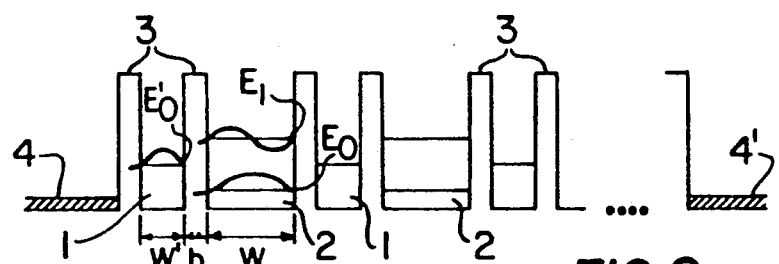
FIG. 2 is an energy-band diagram of the structure under no bias and FIG. 3 is an energy-band diagram of the structure under sufficient bias to emit infrared radiation.

The layered structure of a semiconductor device according to the present invention is shown in FIG. 1. The layers in FIG. 1 constitute a superlattice structure having thin narrow wells 1 and wide wells 2 separated by barrier layers 3. The structure can be formed of AlGaAs-GaAs material AlGaAs for barriers and GaAs for wells. Both semiconductive materials are undoped (or not intentionally doped) to be substantially electrically nonconducting. The narrow well has a width w' as shown in FIG. 2 and only one quasibound state $E'_0$. The wide well 2 has a width w and has two states $E_0$ and $E_1$ where $E_0$ is the ground state and $E_1$ is the first excited state. The energy-band diagram of the device is shown in FIG. 2 under 0 bias with $E'_0 \approx (E_0+E_1)/2$ by adjusting the well widths, w' and w. Heavily N-type doped contact layers 4 and 4' are provided at the top and bottom of the superlattice structure as shown in FIG. 1 so that photon fields are confined in the undoped superlattice structure.

Figure 3:
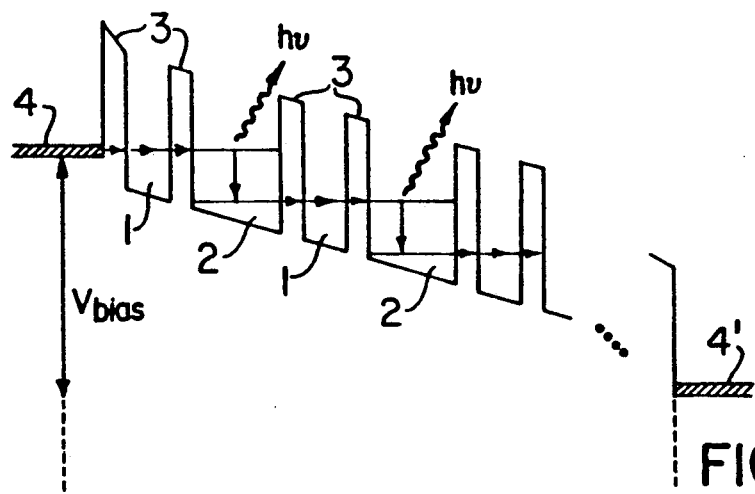

FIG. 3 illustrates the energy-band diagram of the device when it is biased into operation. Under operating conditions, electrons are injected into the higher state $E_1$ of the wide well 2 by resonant tunneling through $E_0'$ of the narrow well. This type of injection process is efficient with the tunneling probability being close to one. An electron in the higher state $E_1$ of a wide well 2 can relax to a lower state $E_0$ emitting a photon (hν) in the process. This relaxed electron at $E_0$ continues to tunnel resonantly to the next wide well where it is again located at the higher state $E_1$ and relaxes to the lower $E_0$ emitting another photon. This process continues from wide wells to wide wells providing an infrared emitting device.

The width b of the barrier layers in the device are adjusted to be thin enough so that the tunneling time through a double-barrier structure between two adjacent wide wells is somewhat faster than the radiative relaxation time. For an AlGaAs-GaAs structure with about a 10 μm separation between the ground state and the first excited state subbands, a radiative relaxation time faster than about 0.1 ps may be required. Compared with simple superlattice structures, the present device provides efficient and rapid electron transfers between the active regions formed by the wide wells 2. This favours the radiative emission processes.

In a particular example of a 10 μm infrared emitting device formed of $Al_xGa_{1-x}As$-GaAs material, a choice of an alloy where x=0.45 gives a barrier height of 0.31 eV. A width w=82 Å provides an $E_0$=0.042 eV and $E_1$=0.166 eV with a width w'=40 Å providing a single state $E'_0$=0.103 eV in the narrow well so that $E'_0 \approx (E_1+E_0)/2$. A barrier width b of about 15 Å permits a tunneling time through the double barrier between two adjacent wide wells of less than 0.05 ps. Since the emitted radiation hν has a wavelength of $hc/(E_1-E_0)$, this particular device will emit radiation in the 10 μm range. The wavelength of the emitted radiation can be varied between about 2 to 10 μm and longer by varying the parameters of the structure.

Various modifications may be made to the preferred embodiment without departing from the spirit and scope of the invention as defined in the appended claims.

I claim:

1. A semiconductor device which can emit infrared radiation in the mid-to far-infrared range comprising an active semiconductor region consisting of alternating thin layers of substantially undoped semiconductive material forming a superlattice structure wherein the structure consists of alternating narrow and wide wells separated by thin barriers, the narrow wells having a width w' and wide wells a width w and designed such that the narrow wells have only one quasibound state $E'_0$ and the wide wells have two states $E_0$ and $E_1$ under 0 bias, whereby, under a suitable dc bias, electrons in state $E_0$ can resonately tunnel out of the well through the quasibound state $E'_0$ to the first excited $E_1$ of the wide well where it can relax to the ground state $E_0$, emitting infrared radiation in the process.

2. A semiconductor device claimed in claim 1, wherein the superlattice structure is formed of $Al_xGa_{1-x}As$-GaAs material with x≦1.

3. A semiconductor device as claimed in claim 1, wherein the barrier layers have a width b where b has a width such that the tunneling time between two adjacent wide wells is faster than the radiative relaxation time.

4. A semiconductor device as claimed in claim 2, wherein the aluminium fraction x is about 0.45.

5. A semiconductor device as claimed in claim 1, wherein the first and last layer of the superlattice structure are in contact with heavily N-type doped semiconductor material which forms contact layers.

6. A semiconductor device as claimed in claim 2, wherein the barrier layers have a width b where b has a width such that the tunneling time between two adjacent wide wells is faster than the radiative relaxation time.

7. A semiconductor device as claimed in claim 2, wherein the width w is about 82 Å, the width w' is about 40 Å and the width of the barrier layers is about 15 Å.

8. A semiconductor device as claimed in claim 4, wherein the width w is about 82 Å, the width w' is about 40 Å and the width of the barrier layers is about 15 Å.

9. A semiconductor device as claimed in claim 2, wherein the first and last layer of the superlattice structure are in contact with heavily N-type doped semiconductor material which forms contact layers.

10. A semiconductor device as claimed in claim 4, wherein the first and last layer of the superlattice structure are in contact with heavily N-type doped semiconductor material which forms contact layers.

11. A semiconductor device comprising a superlattice structure comprising a plurality of relatively narrow layers and a plurality of relatively wide layers of substantially undoped semiconductor material, the narrow and wide layers being arranged alternately and being separated by thin barrier layers, wherein each wide layer provides a quantum well having two intersubband states having energy levels $E_0$ and $E_1$, and each narrow layer provides a quantum well having only one state having an energy level $E'_0$ which is approximately equal to $(E_0+E_1)/2$, the arrangement being such that under bias of the device electrons resonantly tunnel through the barrier layers from a narrow layer to the energy level $E_1$ in an adjacent wide layer and from the energy level $E_0$ in a wide layer to an adjacent narrow layer, and in the wide layers electrons relax from the energy level $E_1$ to the energy level $E_0$ with emission of infrared radiation having a wavelength in a range of about 2 to 10 μm.

12. A semiconductor device as claimed in claim 11 wherein the superlattice structure comprises AlGaAs-GaAs material.

13. A semiconductor device as claimed in claim 12 wherein each wide layer has a width of about 82 Å, each narrow layer has a width of about 40 Å, and each barrier layer has a width of about 15 Å.

14. A semiconductor device as claimed in claim 13 and including contact areas of heavily N-typed doped semiconductor material between which the superlattice structure is arranged.

15. A semiconductor device as claimed in claim 11 and including contact areas of heavily N-type doped semiconductor material between which the superlattice structure is arranged.

* * * * *